US011335578B2

(12) United States Patent
Yoshida et al.

(10) Patent No.: US 11,335,578 B2
(45) Date of Patent: May 17, 2022

(54) SUBSTRATE TRANSFER APPARATUS AND METHOD OF MEASURING POSITIONAL DEVIATION OF SUBSTRATE

(71) Applicants: KAWASAKI JUKOGYO KABUSHIKI KAISHA, Kobe (JP); KAWASAKI ROBOTICS (USA), INC., Wixom, MI (US)

(72) Inventors: Masaya Yoshida, Himeji (JP); Avish Ashok Bharwani, Santa Clara, CA (US); Ming Zeng, San Jose, CA (US); Simon Jeyapalan, Newark, CA (US); Hajime Nakahara, San Jose, CA (US)

(73) Assignees: KAWASAKI JUKOGYO KABUSHIKI KAISHA, Kobe (JP); KAWASAKI ROBOTICS (USA), INC., Wixom, MI (US)

( * ) Notice: Subject to any disclaimer, the term of this patent is extended or adjusted under 35 U.S.C. 154(b) by 171 days.

(21) Appl. No.: 16/789,814

(22) Filed: Feb. 13, 2020

(65) Prior Publication Data

US 2021/0257242 A1 Aug. 19, 2021

(51) Int. Cl.
*H01L 21/68* (2006.01)
*H01L 21/67* (2006.01)
*G01N 21/95* (2006.01)
*H01L 21/677* (2006.01)

(52) U.S. Cl.
CPC ......... *H01L 21/68* (2013.01); *G01N 21/9501* (2013.01); *H01L 21/67259* (2013.01); *H01L 21/67742* (2013.01)

(58) Field of Classification Search
CPC .......... G01N 21/9501; H01L 21/67259; H01L 21/67742; H01L 21/681; H01L 21/67748
See application file for complete search history.

(56) References Cited

U.S. PATENT DOCUMENTS

| | | | | |
|---|---|---|---|---|
| 5,083,896 A | * | 1/1992 | Uehara | B25J 9/042 414/744.5 |
| 5,486,080 A | * | 1/1996 | Sieradzki | H01L 21/67161 414/217 |
| 6,278,905 B1 | * | 8/2001 | Saito | G05B 19/4189 700/247 |

(Continued)

FOREIGN PATENT DOCUMENTS

| | | |
|---|---|---|
| JP | S63-94653 A | 4/1988 |
| JP | 2009218622 A * | 9/2009 |

*Primary Examiner* — Jarrett J Stark
(74) *Attorney, Agent, or Firm* — Oliff PLC

(57) ABSTRACT

A substrate transfer apparatus of the present invention includes: a robot including a hand configured to hold a substrate, and an arm configured to move the hand; a robot control device configured to set a moving path for the hand and control the arm such that the hand moves on the moving path toward a target position; and a camera disposed so as to be able to capture an image of the substrate held by the hand located at a predetermined confirmation position. The robot control device sets the moving path so as to pass through the confirmation position, obtains an image captured by the camera when the hand is located at the confirmation position, calculates a distance between a predetermined environment and the substrate which are taken in the image, and calculates a positional deviation amount from a reference position of the substrate on the basis of the distance.

7 Claims, 6 Drawing Sheets

(56) References Cited

U.S. PATENT DOCUMENTS

| | | | | |
|---|---|---|---|---|
| 6,315,512 B1* | 11/2001 | Tabrizi | .............. | H01L 21/67126 |
| | | | | 414/217 |
| 6,481,956 B1* | 11/2002 | Hofmeister | .............. | B25J 9/042 |
| | | | | 414/806 |
| 6,748,293 B1* | 6/2004 | Larsen | .............. | H01L 21/67748 |
| | | | | 700/218 |
| 7,059,817 B2* | 6/2006 | Sieradzki | .......... | H01L 21/67745 |
| | | | | 414/217 |
| 7,585,142 B2* | 9/2009 | Aggarwal | .............. | B65G 37/02 |
| | | | | 414/217 |
| 7,690,881 B2* | 4/2010 | Yamagishi | ........ | H01L 21/67201 |
| | | | | 414/744.2 |
| 8,285,418 B2* | 10/2012 | Balan | ................ | H01L 21/67748 |
| | | | | 700/248 |
| 9,149,936 B2* | 10/2015 | Hosek | ...................... | B25J 18/04 |
| 10,224,232 B2* | 3/2019 | Hosek | .............. | H01L 21/67742 |
| 10,724,967 B2* | 7/2020 | Jung | ........................ | G06T 7/11 |
| 2016/0078626 A1* | 3/2016 | Kodama | ............... | H01L 21/681 |
| | | | | 382/149 |
| 2020/0185258 A1* | 6/2020 | Endo | .................... | H01L 21/681 |

\* cited by examiner

SUBSTRATE TRANSFER APPARATUS AND METHOD OF MEASURING POSITIONAL DEVIATION OF SUBSTRATE

BACKGROUND OF THE INVENTION

1. Field of the Invention

The present invention relates to a substrate transfer apparatus and a method of measuring positional deviation of the substrate.

2. Description of the Related Art

Conventionally, an automatic alignment apparatus for a substrate has been known. For example, an automatic alignment apparatus for a substrate according to Japanese Laid-Open Patent Publication No. S63-94653 includes two sensors, two light sources, and a transfer chuck which transfers a substrate. The sensors and the light sources are provided at positions where the sensors and the light sources are located above and below with respect to a substrate and are both symmetrical with respect to the transfer direction of the substrate, such that the periphery of the substrate crosses the space between the two sensors and the two light sources. The transfer chuck suctions and holds the substrate to move the substrate, and the center position of the substrate is calculated on the basis of the output from the sensors at the time when light to the two sensors is blocked. Then, a deviation amount from the coordinates of a reference point of the substrate is calculated.

SUMMARY OF THE INVENTION

However, in the case of the automatic alignment apparatus described in Japanese Laid-Open Patent Publication No. S63-94653, when a positional deviation amount is to be calculated, it is necessary to linearly move the substrate to a great extent toward the transfer direction, which poses a problem that the apparatus is likely to have an increased size.

In order to solve the above problem, a substrate transfer apparatus according to a mode of the present invention includes: a robot including a hand configured to hold a substrate, and an arm configured to move the hand; a robot control device configured to set a moving path for the hand and control the arm such that the hand moves on the moving path toward a target position; and a camera disposed so as to be able to capture an image of the substrate held by the hand located at a predetermined confirmation position. The robot control device sets the moving path so as to pass through the confirmation position, obtains an image captured by the camera when the hand is located at the confirmation position, calculates a distance between a predetermined environment and the substrate which are taken in the image, and calculates a positional deviation amount from a reference position of the substrate on the basis of the distance.

According to this configuration, positional deviation of the substrate can be measured at the confirmation position, and the substrate transfer apparatus capable of compensating for positional deviation of the substrate can be made compact.

The above object, other objects, features, and advantages of the present invention will become more apparent from the detailed description of the preferred embodiment below when taken in conjunction with the accompanying drawings.

DESCRIPTION OF THE PREFERRED EMBODIMENTS

Figure 1:
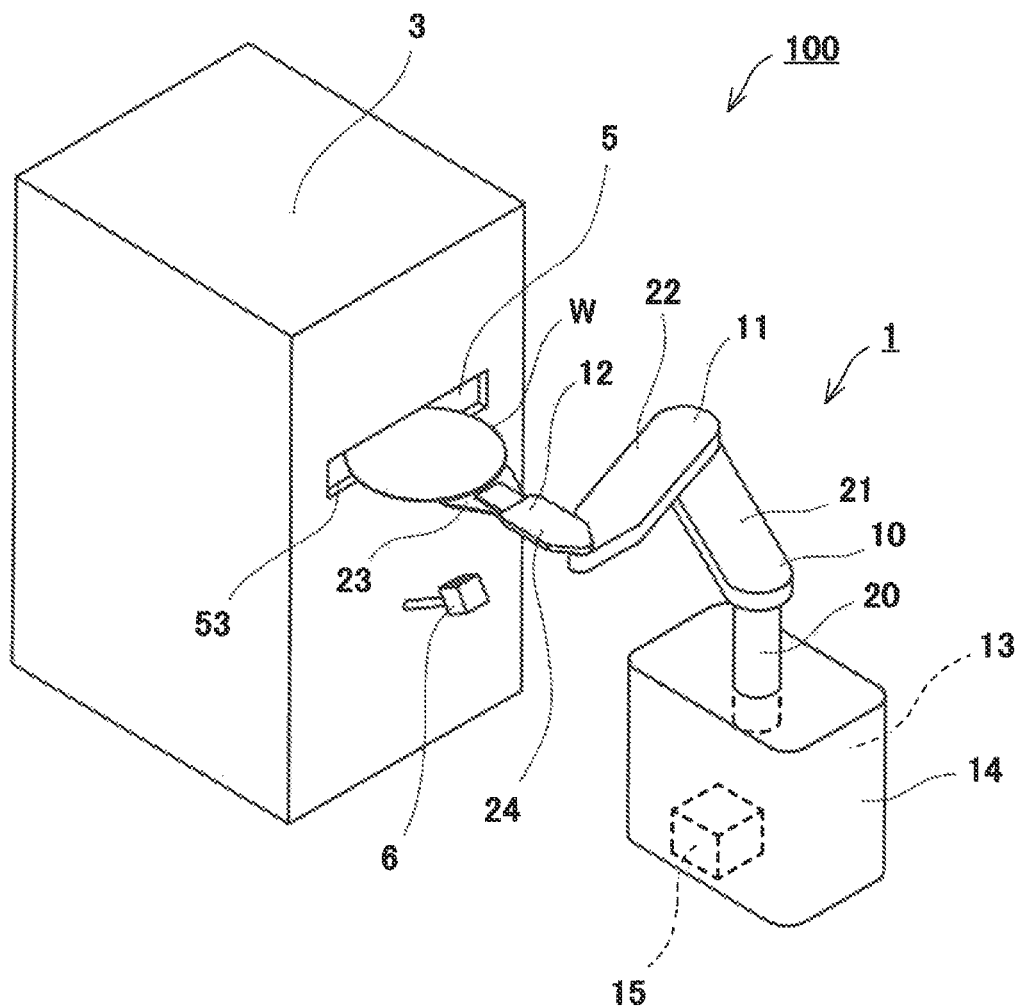
FIG. 1 is a perspective view showing a configuration example of substrate processing equipment including a substrate transfer apparatus according to an embodiment.

Hereinafter, an embodiment will be described with reference to the drawings. It should be noted that the present invention is not limited in any way by the embodiment below. In the following, the same or corresponding elements are denoted by the same reference characters in all the drawings and such elements are not repeatedly described.

Figure 2:
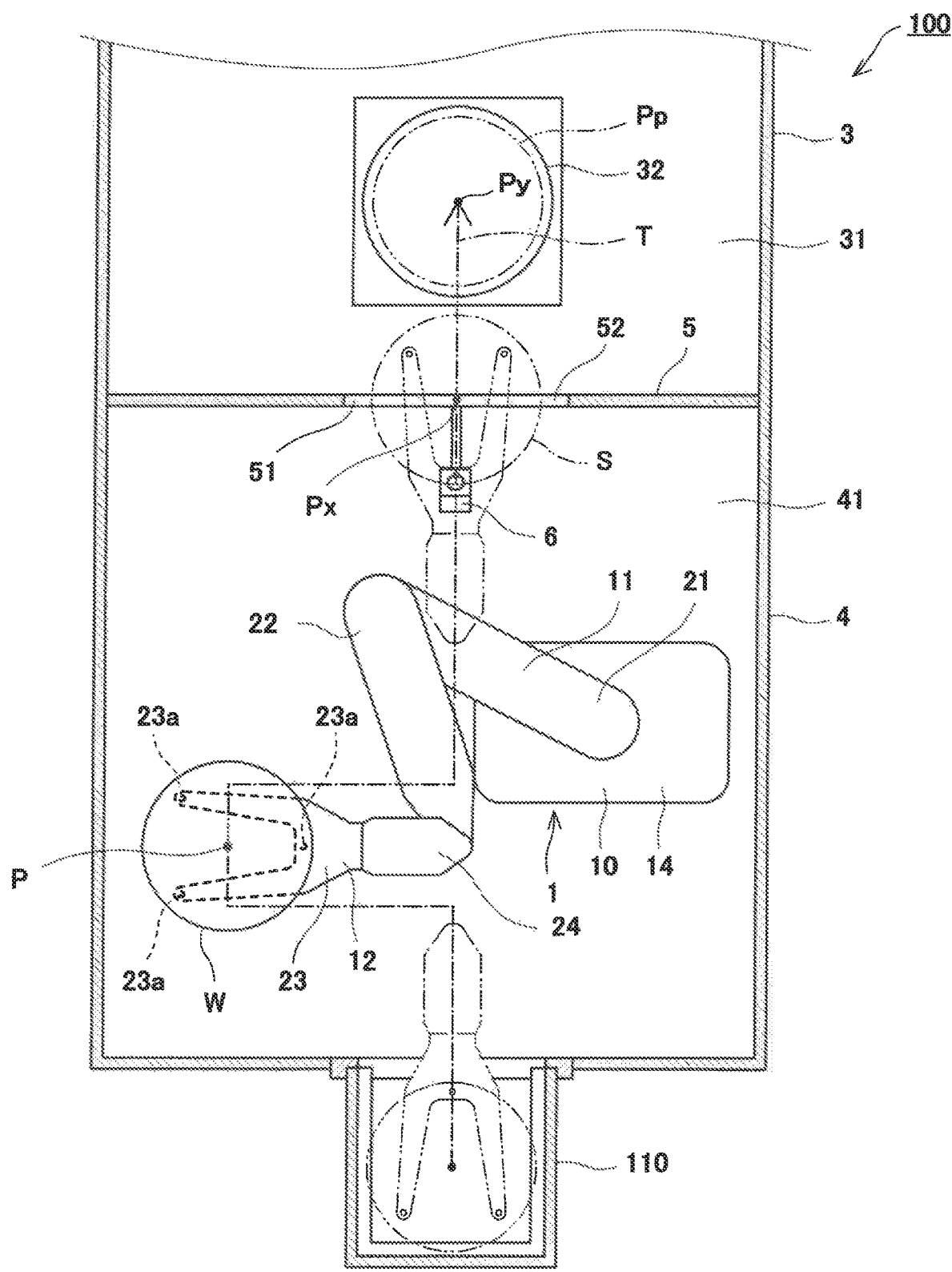
FIG. 2 is a plan view showing the configuration example of the substrate processing equipment in FIG. 1.

FIG. 1 is a perspective view showing a configuration example of substrate processing equipment 100 including a substrate transfer apparatus 1 according to an embodiment. FIG. 2 is a plan view showing the configuration example of the substrate processing equipment 100.

As shown in FIG. 1 and FIG. 2, the substrate processing equipment 100 is equipment for subjecting a substrate W to various processes such as a heat treatment, an impurity doping process, a thin film formation process, a lithography process, a cleaning process, a flattening process, and the like. In the present embodiment, the substrate W is a semiconductor wafer, and examples thereof include silicon wafers, sapphire (single crystal alumina) wafers, and other various types of wafers. The substrate W may be a glass substrate, and examples of the glass wafer include glass substrates for FPD (Flat Panel Display), and glass substrates for MEMS (Micro Electro Mechanical Systems).

The substrate processing equipment 100 includes a chamber 3 and a transfer chamber 4. The chamber 3 is connected to the transfer chamber 4 via a gate 5. The substrate transfer apparatus 1 is installed in a transfer compartment 41 of the transfer chamber 4. A plurality of the substrates W are transferred in a state of being stored in a carrier 110 referred to as FOUP (Front Opening Unified Pod), to the substrate processing equipment 100, to be connected to the transfer chamber 4. Then, the substrate transfer apparatus 1 takes out a substrate W stored in the carrier 110, and transports the substrate W through the transfer compartment 41 of the transfer chamber 4 to a substrate placement position Pp in a compartment 31 of the chamber 3. For example, a stage 32 on which the substrate W is to be placed is provided at the substrate placement position Pp. For example, the compartment 31 is a process compartment for subjecting the substrate W to various processes, or a transfer compartment for transferring the substrate W to still another chamber 3. The substrate W that is transferred from the transfer chamber 4 into the chamber 3 passes through an opening 51 of the gate 5 provided between the compartment 31 of the chamber 3 and the transfer compartment 41 of the transfer chamber 4. The gate 5 separates the compartment 31 and the transfer compartment 41. The opening 51 is open to the compartment 31 and the transfer compartment 41, and is a passage that connects the compartment 31 and the transfer compartment 41 to each other. The opening peripheral edge 52 of the opening 51 is formed in a substantially horizontally-long quadrangular shape, for example. The opening 51 has a width dimension greater than the diameter of the substrate W. The substrate placement position Pp is positioned, in a plan view, on a straight line that extends from the gate 5 in the depth direction of the compartment 31. Accordingly, if the substrate W is inserted straight from the gate 5 (specifically, a confirmation position Px described later), the substrate W can be located at the substrate placement position Pp.

The substrate W having been transported to the substrate placement position Pp is subjected to prescribed processing in the chamber 3 or the like. Then, the substrate W is transported by the substrate transfer apparatus 1 from the substrate placement position Pp to the carrier 110, to be stored again in the carrier 110. In order to prevent, for example, attachment of particles to the substrate W during these procedures, the substrate processing equipment 100 includes a device (not shown) for keeping the degrees of cleanliness of the compartment 31 and the transfer compartment 41 high. In addition, the gate 5 functions as a partition wall for keeping the degree of cleanliness on the chamber 3 side high.

The substrate transfer apparatus 1 is an apparatus that transfers the substrate W, and includes a robot 10, a robot control device 15, and a camera 6.

The robot 10 is a SCARA-type horizontal multi-articulated robot, for example. The robot 10 moves by way of an arm 11 in a three dimensional manner, i.e., in three-axis directions that are orthogonal to one another. The robot 10 includes a base 14 which is provided in the transfer compartment 41, the arm 11, a hand 12, and an arm drive unit 13.

The hand 12 is a passive hand, and includes a blade 23 and a wrist 24 connected to a proximal end portion of the blade 23. The blade 23 is in a flat plate shape in the entirety thereof, and is held by the arm 11 such that the upper face of the blade 23 is kept horizontal. The blade 23 holds, with frictional force, the substrate W placed on three pads 23a provided on the upper face of the blade 23. The hand 12 is not limited to a passive hand. The hand 12 may be a suction hand, such as a Bernoulli hand, that suctions and holds a work piece, i.e., the substrate W, or an edge grip hand that grips an edge of the substrate W.

The arm 11 has a multi-articulated structure including a plurality of joints. The arm 11 has a proximal end portion thereof coupled to the base 14, and has a distal end portion thereof coupled to the wrist 24. The arm 11 includes a plurality of links (a lifting/lowering shaft 20, a lower arm 21, and an upper arm 22) that are sequentially coupled through joints in a direction from the proximal end portion toward the distal end portion.

The lifting/lowering shaft 20 is connected to the base 14 so as to be movable in the up-down direction. The lower arm 21 has a proximal end portion thereof coupled through a joint to the upper end of the lifting/lowering shaft 20 so as to be rotatable about a rotation axis extending in the up-down direction. The upper arm 22 has a proximal end portion thereof coupled through a joint to a distal end portion of the lower arm 21 so as to be rotatable about a rotation axis extending in the up-down direction. The wrist 24 has a proximal end portion thereof coupled through a joint to a distal end portion of the upper arm 22 so as to be rotatable about a rotation axis extending in the up-down direction.

The arm drive unit 13 is a mechanism that rotates the lower arm 21, the upper arm 22, and the blade 23 at the joints, thereby moving the hand 12 in the horizontal direction. In addition, the arm drive unit 13 is a mechanism that lifts/lowers the lifting/lowering shaft 20 to move the entirety of the arm 11 in the up-down direction, thereby moving the hand 12 in the up-down direction.

The robot control device 15 sets a moving path T of an indication point P in accordance with a predetermined operation program. In the present embodiment, the moving path T includes a path along which the hand 12 performs an operation of picking up in the carrier 110 a substrate W to be transferred, and is a path along which, thereafter, the indication point P passes through the confirmation position Px to reach a target position Py. For example, the indication point P is set on the center axis of a circle defined by the points at which the three pads 23a of the blade 23 are located. The confirmation position Px is set at the center of the opening 51, for example. At the confirmation position Px, the hand 12 may take an attitude that extends toward the target position Py. The target position Py is set at the center of the substrate placement position Pp, and at this position, the attitude of the hand 12 at the confirmation position Px is maintained. Then, the robot control device 15 controls the arm 11 such that the indication point P of the hand 12 moves on the moving path T toward the target position Py. Information regarding the moving path T includes not only information that specifies displacement of the position of the hand 12, but also information that specifies displacement of the attitude of the hand 12. Similarly, with respect to the confirmation position Px and the target position Py, information that specifies the attitude of the hand 12 is included. The robot control device 15 is configured to be able to alter the moving path T.

For example, the robot control device 15 includes a control unit that has a computing unit such as a CPU, and the like, and a storage unit that has a memory such as a ROM, a RAM, and the like. The control unit may be implemented as a single controller that performs centralized control, or may be composed of a plurality of controllers that cooperate with each other to perform decentralized control. The storage unit has stored therein a program for generating the moving path T. The computing unit executes the program, thereby controlling the position and attitude of the hand 12.

The camera 6 is a stereo video camera that can capture a stereoscopic image of an object, for example. The camera 6 is used in order to detect positional deviation of the substrate W. The camera 6 is disposed so as to be able to capture an image of the substrate W held by the hand 12 located at the confirmation position Px. In the present embodiment, the camera 6 is attached, at a position below the opening 51, to the side face on the transfer compartment 41 side of the gate 5. Accordingly, the camera 6 is able to simultaneously capture an image of the opening 51 and the substrate W held by the hand 12 located at the confirmation position Px. The camera 6 is directed obliquely upward so as to include the opening peripheral edge 52 of the opening 51 in the field of view. Accordingly, light reflected at the surface of the substrate W can be inhibited from being captured in the captured image G, and thus, accurate image processing can be performed. In addition, since the camera 6 is located on the lower face side of the substrate W, attachment of particles to the upper face of the substrate W can be prevented. The image G captured by the camera 6 is inputted to the robot control device 15. The camera 6 may be a general-purpose camera that can be used for a purpose other than the purpose of detecting positional deviation of the substrate W. Since the camera 6 is a stereo video camera that can capture a stereoscopic image of an object, the distance between the camera 6 and the substrate W can be obtained.

Operation Example

Next, operation examples of the substrate transfer apparatus 1 are described.

As shown in FIG. 2, first, the robot control device 15 sets a moving path T. Then, the robot control device 15 controls the arm 11 such that the hand 12 picks up in the carrier 110 a substrate W to be transferred.

Figure 3:
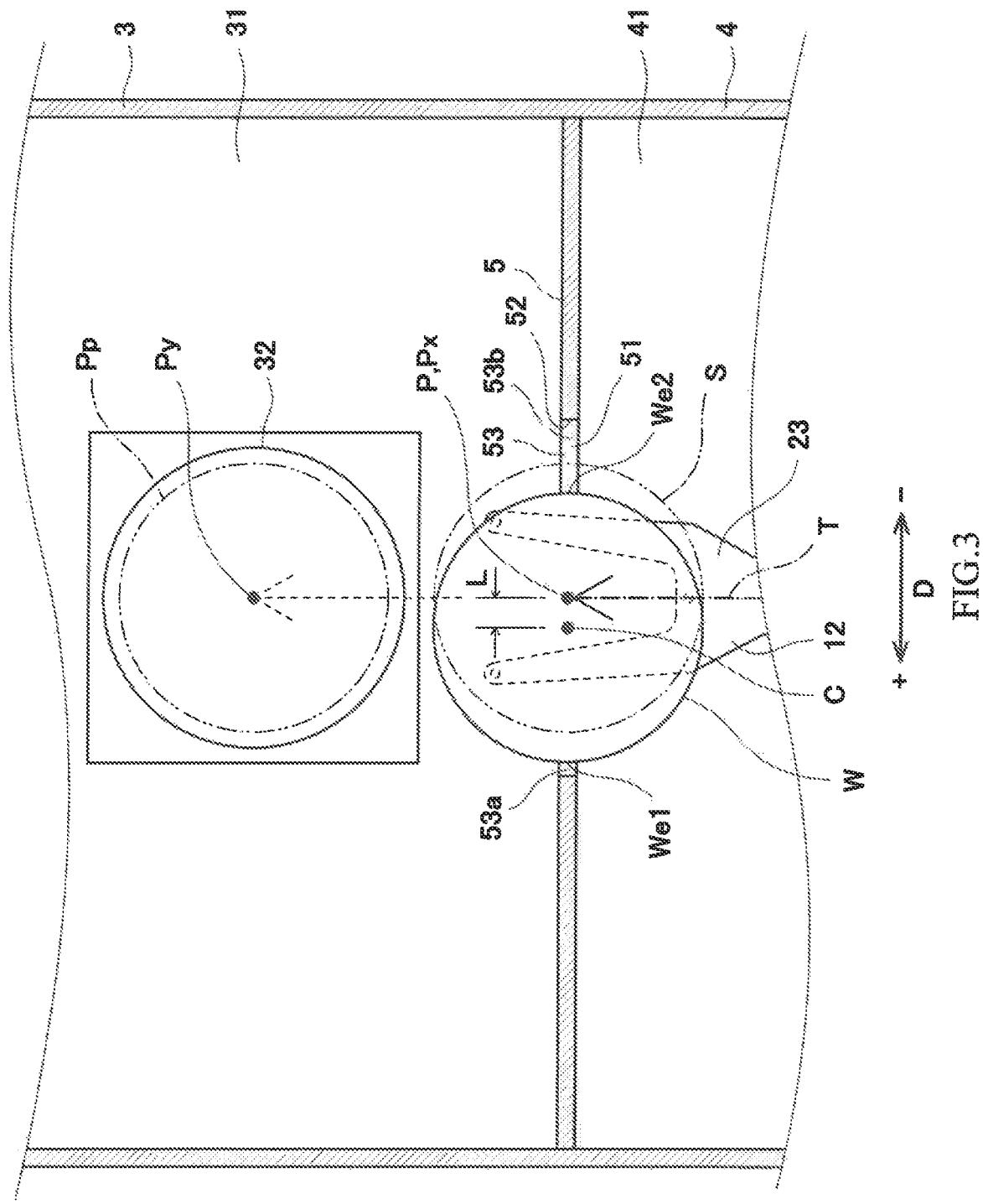
FIG. 3 is a plan view showing an operation example of the substrate processing equipment in FIG. 1, and shows a state where a hand is located at a confirmation position.

FIG. 3 shows a state where the indication point P of the hand 12 is located at the confirmation position Px. FIG. 3 shows an example in which the substrate W is placed on the blade 23 with a center C of the substrate W being deviated from the indication point P of the blade 23.

Next, the robot control device 15 controls the arm 11 such that the indication point P of the hand 12 holding the substrate W moves on the moving path T toward the confirmation position Px, which is a passing point. Then, as shown in FIG. 3, when the indication point P of the hand 12 is located at the confirmation position Px, the robot control device 15 causes the hand 12 to stop temporarily.

Figure 4:
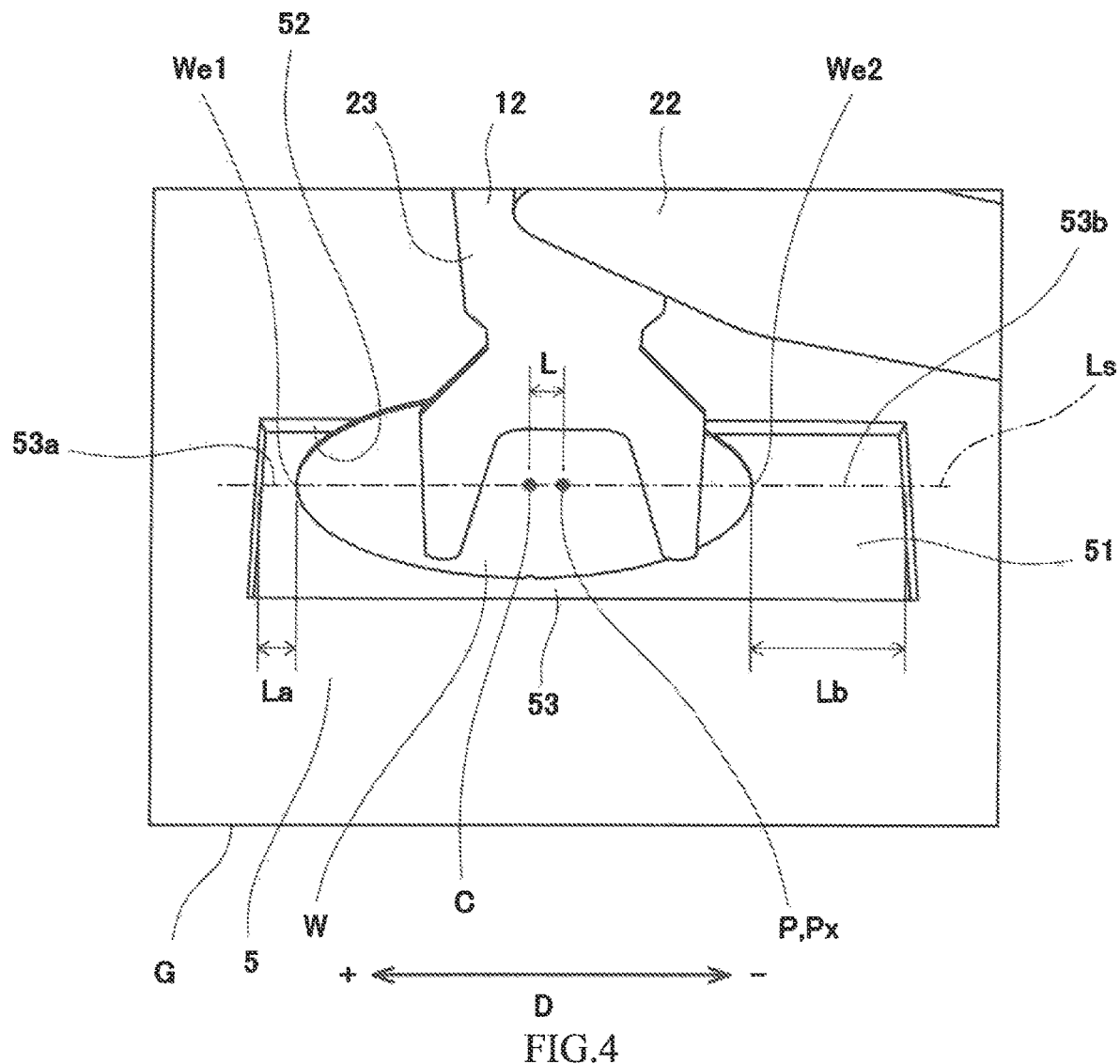
FIG. 4 shows an operation example of the substrate processing equipment in FIG. 1, and shows an image captured by a camera of the hand located at the confirmation position.

FIG. 4 shows an image captured by the camera 6, of the hand 12 located at the confirmation position Px.

Next, the robot control device 15 obtains the image G captured by the camera 6 at the time point when the indication point P of the hand 12 is located at the confirmation position Px. Then, the robot control device 15 calculates the distance between the substrate W and a predetermined environment around the substrate W and the substrate transfer apparatus 1, which are taken in the image G as shown in FIG. 4. Then, on the basis of the distance, the robot control device 15 calculates a positional deviation amount L from a reference position S of the substrate W. In the present embodiment, the above-mentioned predetermined environment is the opening peripheral edge 52, and more specifically, is right and left side edges extending in the up-down direction of the opening peripheral edge 52. The robot control device 15 calculates the dimension of a gap 53 between the substrate W and the opening peripheral edge 52 located adjacent thereto, and calculates the positional deviation amount L from the reference position S of the substrate W on the basis of the dimension of the gap 53. Positional deviation of the substrate W may be one that is caused by positional deviation of the hand 12. For example, positional deviation of the hand 12 is caused due to low repeat accuracy of the robot 10.

Specifically, the robot control device 15 calculates a dimension La of a first gap 53a, which is the gap between the opening peripheral edge 52 and a first end portion We1 of the substrate W in a positional deviation direction D which are taken in the image G, and a dimension Lb of a second gap 53b, which is the gap between the opening peripheral edge 52 and a second end portion We2 of the substrate W in a positional deviation direction D which are taken in the image G. The positional deviation direction D is a direction along which the positional deviation amount is measured, and is the width direction of the opening 51, for example. The first end portion We1 and the second end portion We2 may be portions on a straight line Ls extending in the positional deviation direction D and passing through the center C of the substrate W. The first gap 53a may be the gap between the first end portion We1 and a portion where the straight line Ls passes through the opening peripheral edge 52. Similarly, the second gap 53b may be the gap between the second end portion We2 and a portion where the straight line Ls passes through the opening peripheral edge 52. The positional deviation amount L is calculated by using the following formula.

$$L=(La+Lb)/2-La$$

That is, the positional deviation amount L is, when a position where the dimensions of the pair of the gaps 53a and 53b are equal to each other is defined as the reference position S, a positional deviation amount, with a positive or negative sign, of the substrate W from the reference position S in the positional deviation direction D. In this manner, the robot control device 15 calculates the positional deviation amount L from the reference position S of the substrate W on the basis of the dimensions of the pair of the gaps 53a and 53b between the environment and the pair of the end portions We1 and We2.

Figure 5:
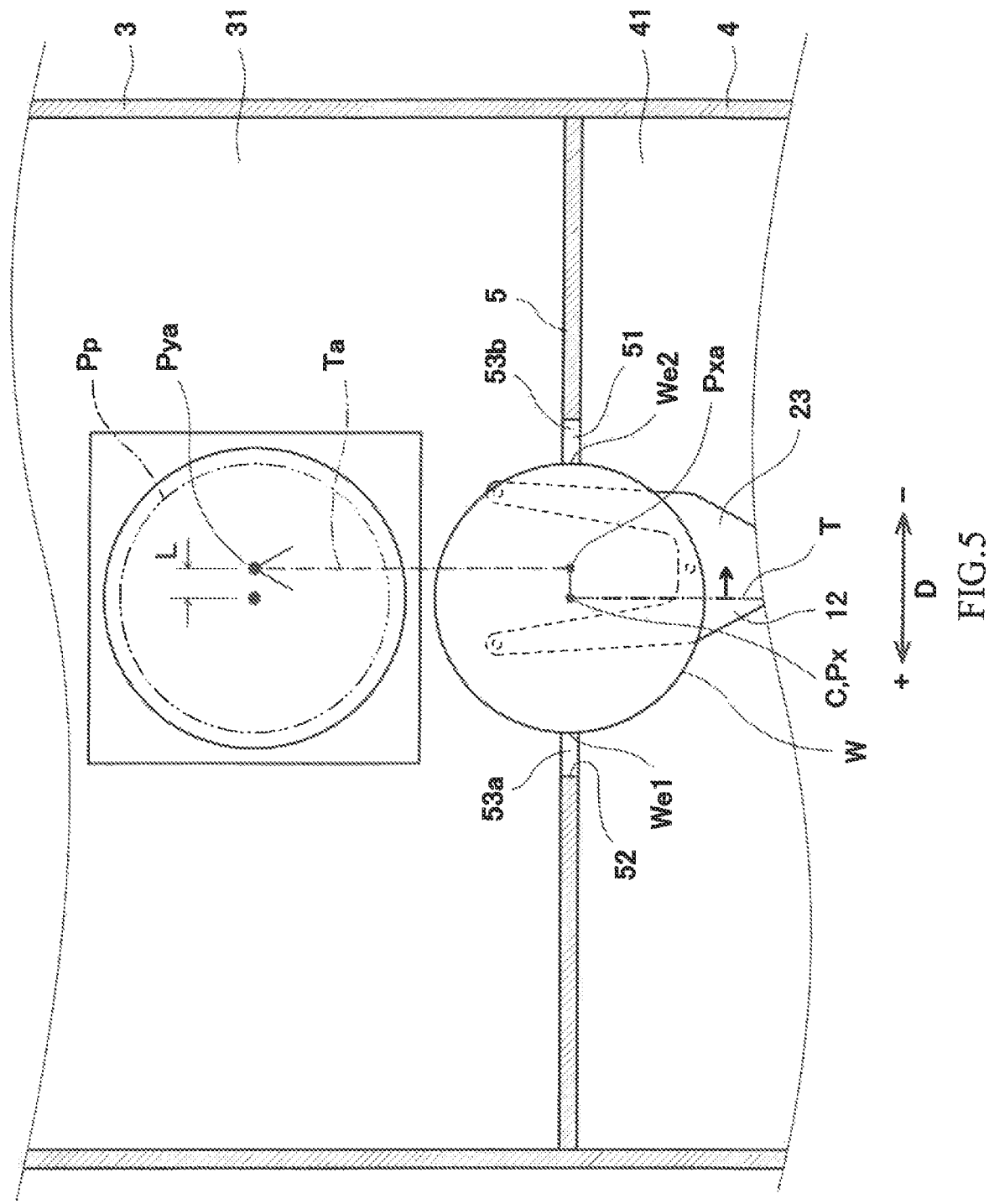
FIG. 5 is a plan view showing an operation example of the substrate processing equipment in FIG. 1, and shows a state where a moving path for the hand is altered.

FIG. 5 shows a state where the indication point P of the hand 12 is located at an altered confirmation position Pxa.

Next, as shown in FIG. 5, the robot control device 15 corrects the moving path T and the target position Py on the basis of the positional deviation amount L. Specifically, the robot control device 15 calculates an altered moving path Ta obtained by moving (shifting) the moving path T extending from the confirmation position Px to the target position Py, by −L in the positional deviation direction D.

Next, the robot control device 15 resumes the moving of the hand 12 having been temporarily stopped, and causes the hand 12 to move (shift) by the positional deviation amount L in the positional deviation direction D such that the indication point P of the hand 12 is located at the altered confirmation position Pxa, which is the start point of the altered moving path Ta. Accordingly, the position of the substrate W is compensated for in the positional deviation direction D such that the center C of the substrate W matches the confirmation position Px.

Next, the robot control device 15 causes the hand 12 to move on the altered moving path Ta so that the hand 12 is located at an altered target position Pya, which is the end point of the altered moving path Ta. As described above, the attitude of the hand 12 at the altered target position Pya is the attitude, of the hand 12 at the altered confirmation position Pxa, being maintained. Thus, reoccurrence of positional deviation of the substrate W can be prevented.

As described above, at the confirmation position Px, without moving the substrate W, the substrate transfer apparatus 1 of the substrate processing equipment 100 can measure positional deviation of the substrate W caused due to transport of the carrier 110, transfer of the substrate W by the substrate transfer apparatus 1, and the like, or the positional deviation amount L of the substrate W due to low repeat accuracy of the substrate transfer apparatus 1. Accordingly, the substrate transfer apparatus capable of detecting positional deviation of the substrate W can be made compact. In addition, the configuration for measuring the positional deviation amount L from the reference position S of the substrate W can be simplified. This is advantageous for manufacture, and in addition, the manufacturing cost is reduced.

The robot control device 15 may correct the target position Py on the basis of the positional deviation amount L. Accordingly, the positional deviation in the positional deviation direction D of the substrate W from the substrate placement position Pp can be compensated for.

The hand 12 may allow positional deviation in the positional deviation direction D from the reference position S, and the robot control device 15 may calculate the positional deviation amount L from the reference position S of the substrate W on the basis of the dimensions of the pair of the gaps 53 between the environment and the pair of the end portions of the substrate W in the positional deviation direction D which are taken in the image G. Accordingly, the positional deviation amount L from the reference position S of the substrate W can be appropriately measured.

Further, the reference position S may be a position where the dimensions of the pair of the gaps 53 are equal to each other at the confirmation position Px. Accordingly, the positional deviation amount L from the reference position S of the substrate W can be appropriately measured.

The environment may be the opening peripheral edge 52 of the gate 5, of the substrate processing equipment 100, through which the substrate W moving on the moving path passes. Accordingly, the positional deviation amount L from the reference position S of the substrate W can be appropriately measured.

Modification

Figure 6:
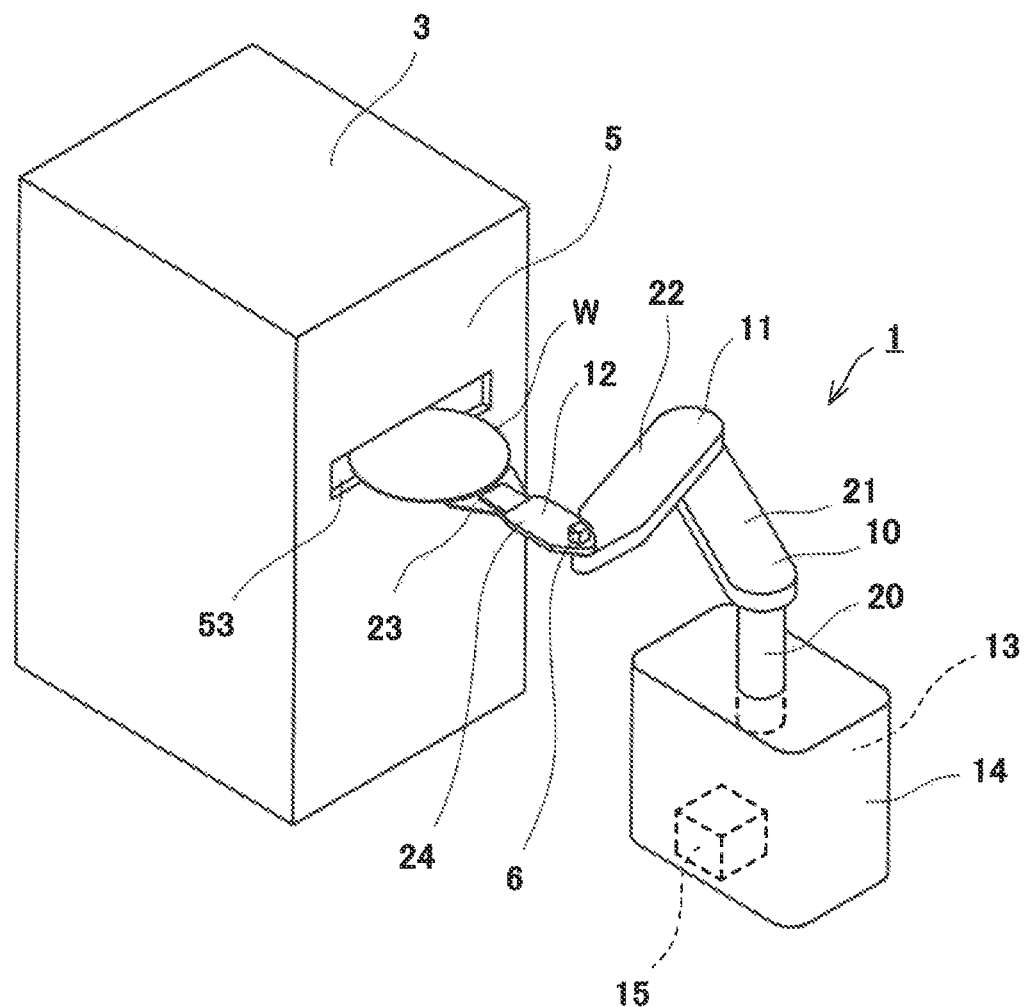
FIG. 6 shows a modification of the substrate transfer apparatus in FIG. 1.

In the embodiment above, the camera 6 is attached to the gate 5, but the present invention is not limited thereto. Instead, as shown in FIG. 6, the camera 6 may be attached to the wrist 24.

In the embodiment above, positional deviation of the substrate W is measured, with the hand 12 being temporarily stopped at the confirmation position Px. However, the present invention is not limited thereto. Instead, while causing the hand 12 to move, the robot control device 15 may measure positional deviation on the basis of an image G at the time point when the indication point P passes through the confirmation position Px. Then, on the basis of the measurement result, the robot control device 15 may compensate for the positional deviation of the substrate W near the substrate placement position Pp.

Further, in the embodiment above, positional deviation of the substrate W in a direction orthogonal to the positional deviation direction D on the horizontal plane is not compensated for, but said positional deviation of the substrate W may be compensated for. For example, positional deviation of the substrate W in the direction orthogonal to the positional deviation direction D on the horizontal plane may be compensated for on the basis of an image G captured by the camera 6, which is a stereo camera.

In the embodiment above, the positional deviation amount L is measured on the basis of the dimension of the gap 53. However, the present invention is not limited thereto. For example, an image that includes both the stage 32 and the substrate W located at a predetermined position may be captured, and on the basis of the positional relationship between the stage 32 and the substrate W captured in this image, the positional deviation amount L may be measured.

From the above description, various modifications and other embodiments of the present invention are apparent to a person skilled in the art. Therefore, the above description should be interpreted as illustrative only, and is provided for the purpose of teaching the best mode for carrying out the present invention to the person skilled in the art. The details of the structures and/or the functions of the present invention may be modified without departing from the spirit of the present invention.

What is claimed is:

1. A substrate transfer apparatus comprising:
    a robot including a hand configured to hold a substrate, and an arm configured to move the hand;
    a processor programmed to set a moving path for the hand and control the arm such that the hand moves on the moving path toward a target position; and
    a camera disposed so as to be able to capture an image of the substrate held by the hand located at a predetermined confirmation position, wherein
    the processor is programmed to set the moving path so as to pass through the confirmation position, obtain an image captured by the camera when the hand is located at the confirmation position, calculate a distance between a predetermined environment and the substrate which are taken in the image, and calculate a positional deviation amount from a reference position of the substrate on the basis of the distance, wherein the environment is an opening peripheral edge of a gate, of substrate processing equipment, through which the substrate moving on the moving path passes.

2. The substrate transfer apparatus according to claim 1, wherein the processor corrects the target position on the basis of the positional deviation amount.

3. The substrate transfer apparatus according to claim 1, wherein
    the hand allows positional deviation in a positional deviation direction from the reference position, and
    the processor calculates the positional deviation amount from the reference position of the substrate on the basis of dimensions of a pair of gaps between the opening peripheral edge of the gate and a pair of end portions of the substrate in the positional deviation direction which are taken in the image.

4. The substrate transfer apparatus according to claim 3, wherein the reference position is a position where the dimensions of the pair of gaps are equal to each other at the confirmation position.

5. The substrate transfer apparatus according to claim 2, wherein
    the hand allows positional deviation in a positional deviation direction from the reference position, and
    the processor calculates the positional deviation amount from the reference position of the substrate on the basis of dimensions of a pair of gaps between the opening peripheral edge of the gate and a pair of end portions of the substrate in the positional deviation direction which are taken in the image.

6. The substrate transfer apparatus according to claim 5, wherein the reference position is a position where the dimensions of the pair of gaps are equal to each other at the confirmation position.

7. A method of measuring positional deviation of a substrate, the method comprising:
    setting a moving path so as to pass through a predetermined confirmation position;
    obtaining an image captured by a camera when a hand holding the substrate and moving on the moving path is located at the confirmation position;
    calculating a distance between a predetermined environment and the substrate which are taken in the image wherein the environment is an opening peripheral edge of a gate, of substrate processing equipment, through which the substrate moving on the moving path passes; and calculating a positional deviation amount from a reference position of the substrate on the basis of the distance.

\* \* \* \* \*